United States Patent
Sanchis

(10) Patent No.: US 9,690,643 B2
(45) Date of Patent: Jun. 27, 2017

(54) ENGINE-CONTROL COMPUTER AND METHOD FOR DETECTING FAILURES OF SUCH A COMPUTER

(71) Applicant: SNECMA, Paris (FR)

(72) Inventor: Ghislain Sanchis, Paris (FR)

(73) Assignee: SNECMA, Paris (FR)

(*) Notice: Subject to any disclaimer, the term of this patent is extended or adjusted under 35 U.S.C. 154(b) by 9 days.

(21) Appl. No.: 14/415,908

(22) PCT Filed: Jul. 18, 2013

(86) PCT No.: PCT/FR2013/051745
§ 371 (c)(1),
(2) Date: Jan. 20, 2015

(87) PCT Pub. No.: WO2014/013206
PCT Pub. Date: Jan. 23, 2014

(65) Prior Publication Data
US 2015/0205655 A1    Jul. 23, 2015

(30) Foreign Application Priority Data
Jul. 20, 2012 (FR) .................................. 12 57033

(51) Int. Cl.
*G06F 11/07* (2006.01)
*G05F 1/625* (2006.01)
(Continued)

(52) U.S. Cl.
CPC ............ *G06F 11/079* (2013.01); *G01R 31/40* (2013.01); *G05B 23/0229* (2013.01);
(Continued)

(58) Field of Classification Search
CPC .... G06F 11/079; G06F 1/625; G06F 11/0721; G06F 11/3013; G06F 11/3055;
(Continued)

(56) References Cited

U.S. PATENT DOCUMENTS

| | | | |
|---|---|---|---|
| 4,757,417 A | 7/1988 | Futsuhara | |
| 6,462,557 B1 | 10/2002 | Milanesi et al. | |
| 2008/0062604 A1 | 3/2008 | Brombach et al. | |
| 2011/0095601 A1* | 4/2011 | Johansson | H02J 13/0003 307/9.1 |

FOREIGN PATENT DOCUMENTS

| | | |
|---|---|---|
| EP | 1 052 518 A1 | 11/2000 |
| GB | 2 441 625 A | 3/2008 |

OTHER PUBLICATIONS

International Search Report issued Oct. 28, 2013 in PCT/FR2013/051745 Filed Jul. 18, 2013.
(Continued)

*Primary Examiner* — Todd Melton
(74) *Attorney, Agent, or Firm* — Oblon, McClelland, Maier & Neustadt, L.L.P.

(57) ABSTRACT

An engine-control computer including switches wherein switch voltage type outputs are configured to control some actuators and a device for detecting internal or external failures with respect to the computer including: a circuit for acquisition of current flowing in such a switch; a circuit for acquisition of an input voltage of the switch; a circuit for acquisition of an output voltage of the switch; an electrical monitoring circuit wherein the three inputs are connected respectively to outputs of each of the three circuits, which tests current and voltage level, delivers an invalid status if the current is less than a defined limit current and if the voltage is less than a defined threshold voltage and configured to detect an external failure with respect to the computer. A method detects failures of such a computer.

7 Claims, 3 Drawing Sheets

(51) Int. Cl.
    *G06F 11/30*         (2006.01)
    *H03K 17/18*         (2006.01)
    *G05B 23/02*         (2006.01)
    *G01R 31/40*         (2014.01)
    *G01R 31/02*         (2006.01)

(52) U.S. Cl.
    CPC .......... *G05F 1/625* (2013.01); *G06F 11/0721* (2013.01); *G06F 11/3013* (2013.01); *G06F 11/3055* (2013.01); *H03K 17/18* (2013.01); *G01R 31/024* (2013.01)

(58) Field of Classification Search
    CPC .. G01R 31/40; G01R 31/024; G05B 23/0229; H03K 17/18
    See application file for complete search history.

(56) References Cited

OTHER PUBLICATIONS

French Preliminary Report issued Nov. 27, 2012 in Patent Application No. FR 1257033 Filed Jul. 20, 2012 (with English translation of categories of cited documents).
M. Abul Masrur, et al., "Intelligent diagnosis of open and short circuit faults in electric drive inverters for real-time applications", IET Power Electron., vol. 3, No. 2, XP006034851, Mar. 2010, pp. 279-291.

\* cited by examiner

ENGINE-CONTROL COMPUTER AND METHOD FOR DETECTING FAILURES OF SUCH A COMPUTER

FIELD OF THE INVENTION

The invention relates to an engine-control computer, for example of an aircraft, and a method for detecting failures of such a computer.

STATE OF THE RELATED ART

In an aircraft engine-control system, for example FADEC type ("Full Authority Digital Engine Control"), some actuators are controlled by switch voltage output (SVO) type computer outputs. As these outputs are merely switches, optionally switching a 28-Volt voltage, it is necessary, as for current-controlled outputs, to check that the corresponding control has been carried out correctly, and that there are no failures on these outputs.

In an FADEC type engine-control system 10, there may be dual mechanical relay type switches 11 referred to as "contact monitored", as illustrated in FIG. 1, a dual relay then switches a 28-Volt circuit and a monitoring circuit 12 to check the status of each contact. The voltage v is also measured to check that the switch is operating correctly, the corresponding load being referenced 13, Gnd being the ground.

However such a solution is not suitable for detecting all the external failures with respect to the computer. The only information available is that the computer has correctly closed the relay. Furthermore, there may be a failure on only one relay of the dual relay, which distorts detection. Finally, such a solution is not applicable when the switches are not mechanical relays but MOSFETs ("Metal Oxide Semiconductor Field Effect Transistors"). Contact monitoring is no longer applicable as these are semiconductor switches.

The aim of the invention is that of remedying these drawbacks.

DESCRIPTION OF THE INVENTION

The invention relates to an engine-control computer, for example of an aircraft, comprising switches wherein the switch voltage type outputs are suitable for controlling some actuators and a device for detecting internal or external failures with respect to the computer comprising:
a circuit for the acquisition of the current flowing in such a switch,
a circuit for the acquisition of the input voltage of this switch,
a circuit for the acquisition of the output voltage of this switch,
characterised in that this device further comprises:
an electrical monitoring circuit wherein the three inputs are connected respectively to the outputs of each of these three circuits, which tests the current and voltage level, delivers an invalid status if the current is less than a defined limit current and if the voltage is less than a defined threshold voltage and is suitable for detecting an external failure with respect to the computer.
Advantageously, the device comprises:
a discrete state monitoring circuit wherein the inputs are connected to the outputs of the current acquisition, input voltage acquisition and output voltage acquisition circuits.

Advantageously, the device comprises:
a deviation monitoring circuit wherein one input receives the output signal of this discrete state monitoring circuit and wherein the other input receives a discrete request signal.
Advantageously, the device comprises:
an OR gate wherein one input is connected to the output of the electrical monitoring circuit and wherein the other input is connected to the output of the deviation monitoring circuit,
a confirmation/rehabilitation circuit.

Advantageously, the electrical status at the output of the electrical monitoring circuit corresponds to a failure if the following test is confirmed:
for a low switch voltage type output current v: i<60 mA AND v<5V.
for a high or very high switch voltage type output current v: i<0.4 A AND v<5V.

Advantageously, the discrete state status at the output of the discrete state monitoring circuit is considered to be "closed" if the following test is confirmed:
for a low switch voltage type output current: i≥60 A;
for a high or very high switch voltage type output current: i≥0.4 A.

Advantageously, the deviation status at the output of the deviation monitoring circuit determines that the state of the computer switch is consistent with a discrete request signal:
if the discrete request signal corresponds to supplying the switch voltage type output with the discrete state "closed", then the deviation status is "no failure";
or if the discrete request signal does not correspond to supplying the switch voltage type output with the discrete state "not closed", then the deviation status is "no failure";
otherwise, the deviation status indicates a "failure".

The computer according to the invention is suitable for detecting external failures whereas the prior solutions are only suitable for detecting internal failures. Furthermore, there is no risk of distorting the failure detection, unlike mechanical relays, since cases of failures are detected when the current and voltage values are zero, cases of measurement failures once again being covered.

The invention also relates to a method for detecting internal or external failures of such an engine-control computer, for example of an aircraft, comprising switches wherein the switch voltage type outputs are suitable for controlling some actuators and a device for detecting these failures, characterised in that a final equation is used, giving a "fault detected" value, which is as follows:

$$[(\overline{A}+\overline{B})\cdot(A+B)]+(\overline{B}\cdot C)=1$$

with the following three conditions A, B, C:
A: There is a request to supply the load of such a switch;
B: The current flowing in this switch is greater than a defined current threshold;
C: The power supply voltage is less than a defined voltage threshold.

DETAILED DESCRIPTION OF PARTICULAR EMBODIMENTS

The invention consists of using the measurement of current flowing in a switch in an engine-control computer, for example of an aircraft, in conjunction with voltage measurement in order to detect an internal or external failure in relation to the computer. The combination of three circuits using current and voltage measurements is suitable for checking that the corresponding control has been carried out correctly and that there is no failure. Such a solution is applicable equally well to mechanical switches and semiconductor switches, once a current measurement is available.

Figure 1:
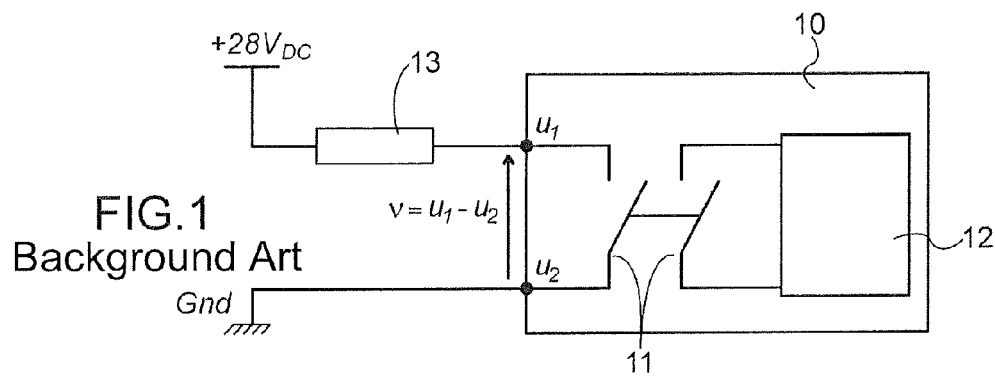
FIG. 1 illustrates a device according to the prior art.
Figure 2:
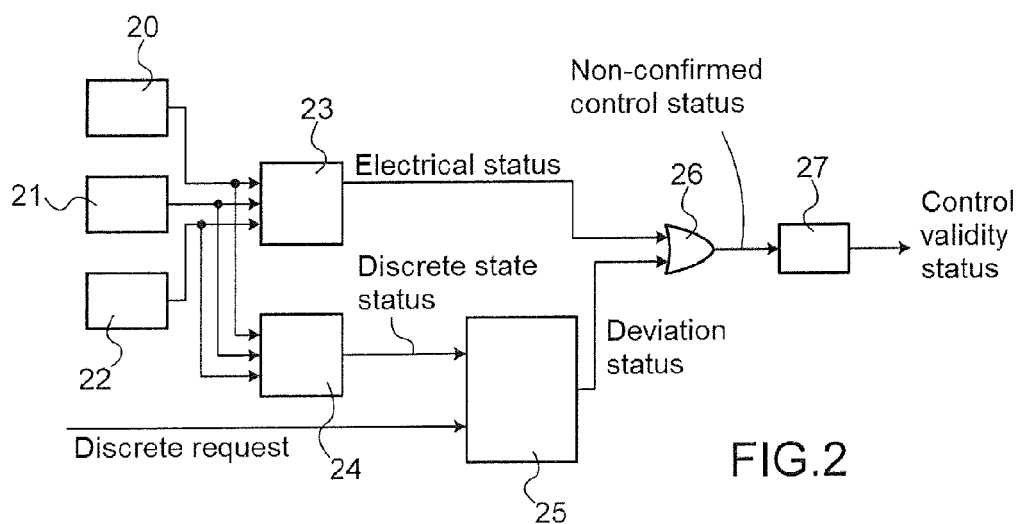
FIG. 2 illustrates the device according to the invention.

As illustrated in FIG. 2, the device according to the invention comprises:
- a circuit 20 for the acquisition of the current flowing in a switch of the computer,
- a circuit 21 for the acquisition of the input voltage of this switch,
- a circuit 22 for the acquisition of the output voltage of this switch,
- an electrical monitoring circuit 23 wherein the three inputs are connected respectively to the outputs of each of these circuits 20, 21 and 22,
- a discrete state monitoring circuit 24 wherein the input is connected to the output of the first of these circuits,
- a deviation monitoring circuit 25 wherein one input receives the output signal of this discrete state monitoring circuit 24 (discrete state status) and wherein the other input receives a discrete request signal,
- an OR gate 26 wherein one input is connected to the output of the electrical monitoring circuit 23 (electrical status) and wherein the other input is connected to the output of the deviation monitoring circuit 25 (deviation status),
- a confirmation/rehabilitation circuit 27 wherein the input is connected to the OR gate output (non-confirmed control status) and wherein the output delivers the control validity status.

The electrical monitoring circuit 23 tests the current and voltage level, and outputs an invalid status if the current is less than a defined limit current (set according to the load in question) and if the voltage is less than a defined threshold voltage (corresponding to a voltage less than the off-load voltage). This circuit is suitable for detecting an external failure in relation to the computer.

The discrete state monitoring circuit 24 tests whether the current level flowing in the switch is greater than a threshold corresponding to half the load power supply current. This circuit is suitable for detecting that the load is powered and thus for determining the switch state.

The deviation monitoring circuit 25 tests whether the state of the switch corresponds to the required set-point. This circuit is suitable for detecting a deviation between the set-point and the control.

It is thus possible to obtain a control validity status accounting for the internal failures in the computer and the external failures in relation thereto. This status is invalid if the electrical state or the deviation state is invalid, making it possible to ensure that the load is powered correctly.

Figure 3A:
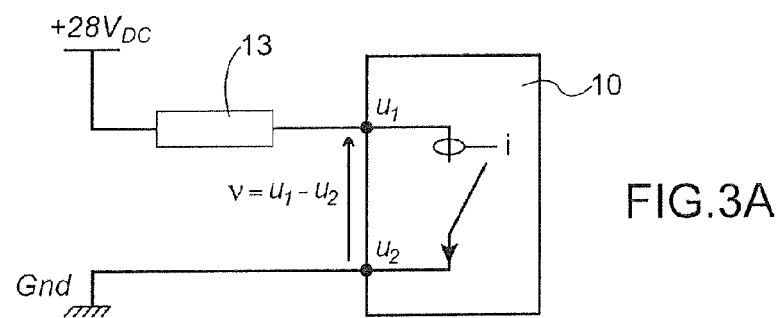
FIGS. 3A and 3B illustrate the operation of the devices according to the invention.
Figure 3B:
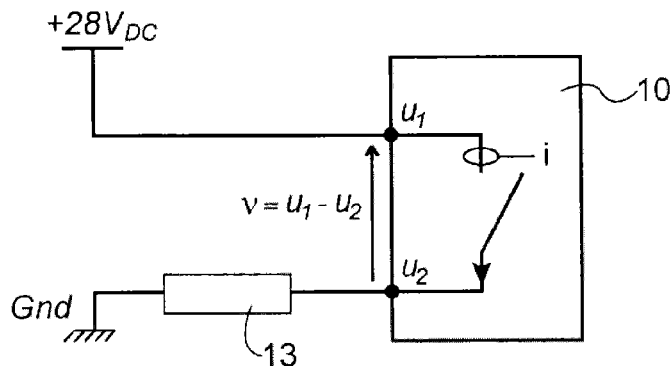

The principle of an electrical interface between the computer and an item of equipment (load 13) is illustrated in FIGS. 3A and 3B. FIG. 3A corresponds to a switch voltage type output with very high current and with low current. FIG. 3B corresponds to a switch voltage output (SVO) with high current. The computer supplies input and output voltage and input current measurements.

The aim of the device according to the invention illustrated in FIG. 2 is that of determining whether the electrical switch voltage type output control is identical to the switch voltage type output request.

Figure 4A:
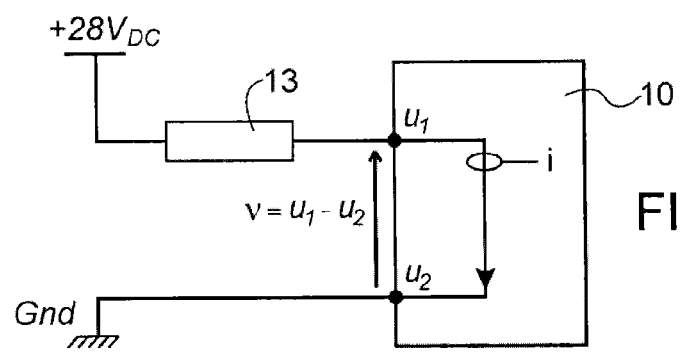
FIGS. 4A to 4F illustrate various possible electrical configurations.
Figure 4B:
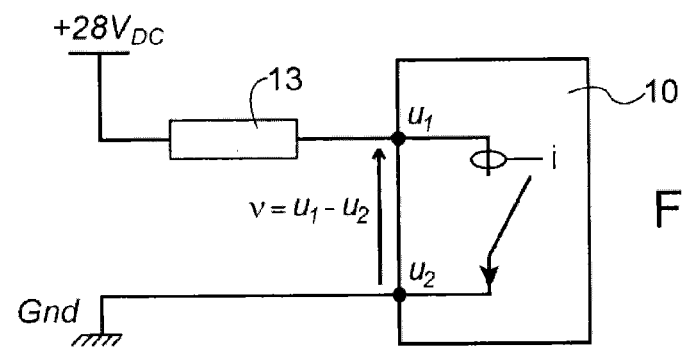
Figure 4C:
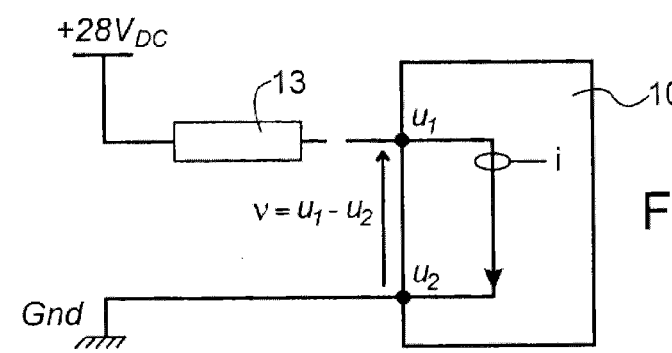
Figure 4D:
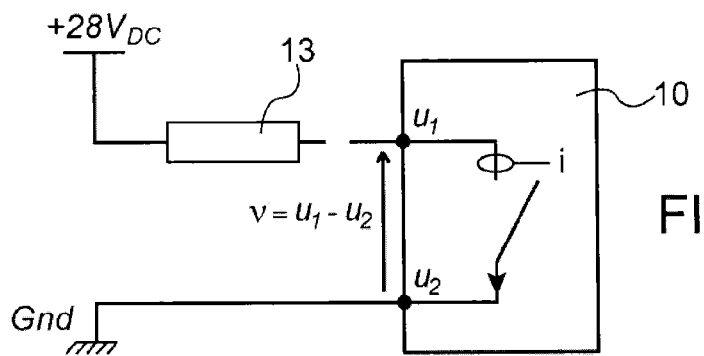
Figure 4E:
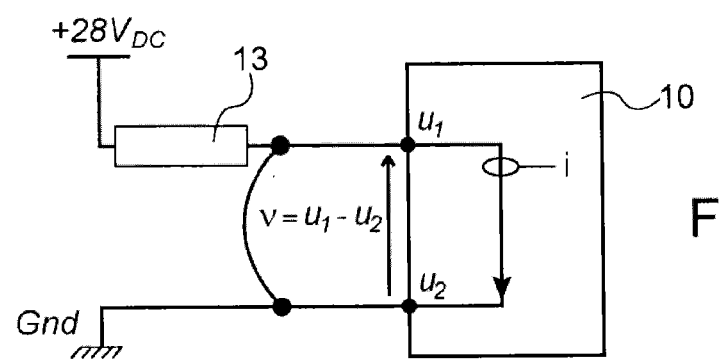
Figure 4F:
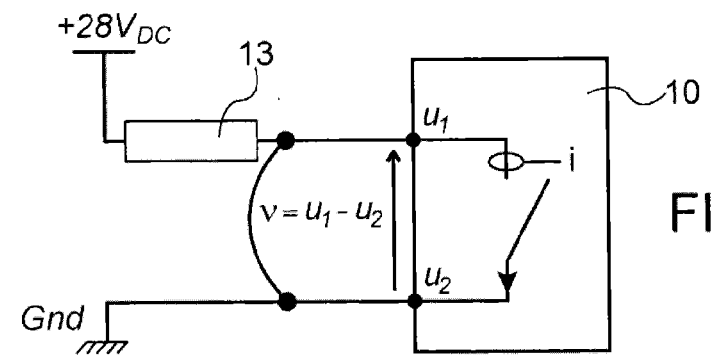

FIGS. 4A and 4D illustrate the possible electrical configurations including normal operation and cases of external failures. The position of the load is not considered to change the logical structure of this device. FIG. 4A illustrates a "closed" control with normal operation (v="Low", i="High"). FIG. 4B illustrates an "open" control with normal operation (v="High", i="Low"). FIG. 4C illustrates a "closed" control with an open circuit type failure (v="Low", i="Low"). FIG. 4D illustrates an "open" control with open circuit type failure (v="Low", i="Low"). FIG. 4E illustrates a "closed" control with a short-circuit type failure (v="Low", i="Low"). FIG. 4F illustrates an "open" control with a short-circuit type failure (v="Low", i="Low").

It ensues that a low voltage and current measured inside the engine-control computer correspond to an electrical failure. Furthermore, a high current means that the switch voltage output is activated by the engine-control computer and powered. The thresholds used to define the "low" and "high" states are dependent on the switch voltage type output category.

The current thresholds are based on the assumption that a very high switch voltage type output current corresponds to a load current between 0.5 A and 5 A, that a high SVO current corresponds to a load current between 0.5 A and 1 A and that a low current corresponds to a charge current between 80 mA and 150 mA.

The electrical monitoring circuit 23 makes it possible to determine whether there is an electrical failure outside the computer. Measurements given by the computer make it possible to detect a short-circuit or open circuit failure. An electrical status corresponds to a failure if the following test is confirmed:
- for a low switch voltage type output current: i<60 mA AND v<5V.
- for a high or very high switch voltage type output current: i<0.4 A AND v<5V.

The discrete state monitoring circuit 24 makes it possible to determine whether the switch, controlling the switch voltage type output inside the computer, is closed. A discrete state is considered to be "closed" if the following test is confirmed:
- for a low switch voltage type output current: i≥60 mA,
- for a high or very high switch voltage type output current: i≥0.4 A.

The deviation monitoring circuit 25 makes it possible to determine whether the state of the switch inside the computer is consistent with the discrete request:
- if the discrete request corresponds to supplying the switch voltage type output with the discrete state "closed" while the deviation status is "no failure";
- or if the discrete request does not correspond to supplying the switch voltage type output with the discrete state "not closed", then the deviation status is "no failure"; otherwise, the deviation status indicates a "failure".

The use of the device according to the invention makes it possible to determine whether the switch voltage type output control is affected by an electrical failure or a deviation failure.

Operating Equation of the Device According to the Invention

For the use of the device according to the invention, three conditions are used:
A: There is a request to power the load;
B: The current flowing in the switch is greater than a defined current threshold;
C: The power supply voltage is less than a defined voltage threshold.

This conditions, referred to as A, B and C, respectively, are used as Boolean variables in the following equations. Each variable equals 1 when the condition is true, 0 if the condition is false.

In this way, the electrical monitoring, discrete state monitoring and deviation monitoring tests may be expressed as follows:
electrical monitoring: the test gives a value "failure" if the following condition is confirmed $\overline{B} \cdot C = 1$;
discrete state monitoring: the test gives a value "closed" if B=1;
deviation monitoring: as this test uses the result from the previous test, the equation may be simplified. This gives a value "no failure" for the following condition $A \cdot B + \overline{A} \cdot \overline{B} = 1$.

The result of this test is then compared with the electrical monitoring. However, with respect to "failure" values, it is necessary to transform the equation above so that it is equal to 1 for a "failure" value, the test becomes: $(\overline{A} + \overline{B}) \cdot (A+B) = 1$.

The final equation giving a "failure detected" value is as follows:

$$[(\overline{A}+\overline{B}) \cdot (A+B)] + (\overline{B} \cdot C) = 1$$

Example of Embodiment: Control of Load Consuming 1 A at 28V

A resistive load controlled by a switch voltage type output is considered, at a voltage of 28 Vdc and consuming a nominal current of 1 A. The equivalent diagram is illustrated in FIG. 3B.

The power supply current being 1 A, a threshold is set, given that in a dual-channel computer, there are two switches in parallel. The current should be less than half the nominal current, thus less than 0.5 A. Furthermore, the measurement precision of this current is taken into account. In this way, if the remeasurement precision is 50 mA, this current threshold must be less than 0.45 A. Furthermore, if there is a short-circuit upstream from the computer, a residual current may flow inside the computer. The threshold thus cannot be too close to 0. It may be set to 0.4 A for example.

For the voltage threshold, it is necessary to account for the voltage remeasurement precision. In this way, a 0V threshold may not be adopted even if this corresponds to reality. If the computer is precise within 2V for example, the threshold may be selected at 3V.

This gives:
In the nominal case, where there is no request to power the load and no failure is detected, there is a voltage but no current and no power supply request thus A=0, B=0 and C=0, the equation $[(\overline{A}+\overline{B}) \cdot (A+B)] + (\overline{B} \cdot C)$ becomes $[(1+1)*(0+0)]+(1*0)$ which equals 0. Therefore, there is no failure.
In the nominal case, with a power supply request, there is current but no voltage and a power supply request, thus A=1, B=1 and C=1 the equation becomes $[(0+0)*(1+1)]+(0*1)$ which equals 0. Therefore, there is no failure.
In the case of an open circuit failure on the voltage input with no power supply request, there is no current or voltage, A=0, B=0 and C=1, the equation becomes $[(1+1)*(0+0)]+(1*1)$ which equals 1. Therefore, there is a failure.
In the case of an open circuit failure on the voltage input with a power supply request, there is no current or voltage, A=1, B=0, C=1, the equation becomes $[(0+1)*(1+0)]+(1*1)$ which equals 1. Therefore, there is a failure.
In the case of a failure of the internal switch which does not close when a load power supply is requested, there is no current, there is voltage, A=1, B=0 and C=0, the equation becomes $[(0+1)*(1+0)]+(1*0)$ which equals 1. Therefore, there is a failure.

The invention claimed is:

1. An engine-control computer comprising switches wherein switch voltage type outputs are configured to control some actuators, the computer further comprising a device for detecting internal or external failures with respect to the computer, the device comprising:
a circuit for acquisition of an input voltage of such a switch;
a circuit for acquisition of an output voltage of the switch;
an electrical monitoring circuit wherein first and second inputs are connected respectively to outputs of each of the two circuits, which tests the input and output voltage level of the switch, and delivers an invalid status if the input or output voltage of the switch is less than a defined threshold voltage; and
a circuit for acquisition of current flowing in the switch, wherein the electrical monitoring circuit includes a third input connected to an output of the circuit for acquisition of the current flowing in the switch, tests a current level and delivers an invalid status if the current is less than a defined limit current and is configured to detect an external failure with respect to the computer, and
wherein the device further comprises:
a discrete state monitoring circuit, wherein an input is connected to the output of the circuit for acquisition of the current flowing in the switch, the discrete state monitoring circuit being configured to determine a state of the switch based on a current level of the current flowing in the switch; and
a deviation monitoring circuit, wherein one input receives an output signal of the discrete state monitoring circuit representative of the state of the switch, and wherein another input receives a discrete request signal representative of a required set-point of the switch, the deviation monitoring circuit being configured to test whether the state of the switch corresponds to the required set-point.

2. The computer according to claim 1, wherein the device comprises:
an OR gate, wherein one input is connected to the output of the electrical monitoring circuit and wherein another input is connected to the output of the deviation monitoring circuit, and
a confirmation/rehabilitation circuit.

3. The computer according to claim 1, wherein an electrical status at the output of the electrical monitoring circuit corresponds to a failure if the following test is confirmed:
for a low switch voltage type output current in the switch: i<60 mA AND v<5V;
for a high or very high switch voltage type output current in the switch: i<0.4 A AND v<5V.

4. The computer according to claim 1, wherein the discrete state status at the output of the discrete state monitoring circuit is considered to be closed if the following test is confirmed:

for a low switch voltage type output current in the switch: i≥60 A;

for a high or very high switch voltage type output current in the switch: i≥0.4 A.

5. The computer according to claim 1, wherein a deviation status at the output of the deviation monitoring circuit determines that a state of the computer switch is consistent with the discrete request signal:

if the discrete request signal for powering a load of the switch corresponds to supplying the switch voltage type output with the discrete state closed, then the deviation status is no failure;

or if the discrete request signal does not correspond to supplying the switch voltage type output with the discrete state not closed, then the deviation status is no failure;

otherwise, the deviation status indicates a failure.

6. The computer according to claim 1, which is an aircraft engine-control computer.

7. A method for detecting internal or external failures of an engine-control computer according to claim 1 comprising switches wherein switch voltage type outputs are configured to control some actuators and a device for detecting the failures, the method comprising:

determining if there is a request to supply a load of the switch;

measuring a current flowing in the switch;

measuring a power supply voltage of the switch; and giving a "failure detected" value if the result of the test $[(\overline{A+B}) \cdot (A+B)] + (\overline{B} \cdot C)$ is equal to 1, wherein A is equal to 1 if there is a request to supply a load of the switch, and equal to 0 otherwise, wherein B is equal to 1 if the current flowing in the switch is greater than a defined current threshold, and equal to 0 otherwise, and wherein C is equal to 1 if the power supply voltage of the switch is less than a defined voltage threshold, and equal to 0 otherwise.

* * * * *